United States Patent
Chen et al.

(10) Patent No.: US 7,940,157 B2
(45) Date of Patent: May 10, 2011

(54) RESISTOR LAYOUT STRUCTURE AND MANUFACTURING METHOD THEREOF

(75) Inventors: Wei-Ting Chen, Tainan County (TW); Chang-Sheng Chen, Taipei (TW); Chin-Sun Shyu, Pindon County (TW); Chang-Lin Wei, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 808 days.

(21) Appl. No.: 11/754,840

(22) Filed: May 29, 2007

(65) Prior Publication Data
US 2008/0258862 A1    Oct. 23, 2008

(30) Foreign Application Priority Data
Apr. 19, 2007   (TW) ............................... 96113782 A

(51) Int. Cl.
*H01C 1/012*    (2006.01)

(52) U.S. Cl. ........ 338/307; 338/309; 338/329; 29/610.1

(58) Field of Classification Search .......... 338/306–309, 338/320, 325, 329
See application file for complete search history.

(56) References Cited

U.S. PATENT DOCUMENTS

| | | | | |
|---|---|---|---|---|
| 4,783,642 A | * | 11/1988 | Takada et al. | ................. 338/309 |
| 6,187,372 B1 | | 2/2001 | Johnson et al. | |
| 6,194,900 B1 | | 2/2001 | Freeman et al. | |
| 6,246,312 B1 | * | 6/2001 | Poole et al. | ................... 338/307 |
| 7,038,571 B2 | | 5/2006 | Dunn et al. | |

* cited by examiner

Primary Examiner — Kyung Lee
(74) Attorney, Agent, or Firm — J.C. Patents

(57) ABSTRACT

A resistor layout structure and a manufacture method thereof are provided. The resistor layout structure includes a substrate, a plurality of metals, and a plurality of resistor lumps. The plurality of metals is disposed on the substrate. The plurality of first resistor lumps is disposed on the substrate. The metals are used as a supporting structure during the disposing process. Besides, the metals are interlaced and connected in series connected with the resistor lumps to form the resistor. Therefore, the present invention decreases the resistance variability of the resistor.

22 Claims, 6 Drawing Sheets

RESISTOR LAYOUT STRUCTURE AND MANUFACTURING METHOD THEREOF

CROSS-REFERENCE TO RELATED APPLICATION

This application claims the priority benefit of Taiwan application serial no. 96113782, filed on Apr. 19, 2007. All disclosure of the Taiwan application is incorporated herein by reference.

BACKGROUND OF THE INVENTION

1. Field of the Invention

The present invention relates to a resistor layout technology. More particularly, the present invention relates to a resistor layout technology, which uses metals as a supporting structure to make the thickness of the resistor more uniform.

2. Description of Related Art

As well-known to the common people, the printing technology is one of the oldest inventions in China. However, in the current electronic industry, many printing technologies are applied to manufacture the electronic products. For example, the printing technology is used to manufacture resistor elements.

The conventional resistor printing technology can be divided into stencil printing technology and screen printing technology. For the stencil printing technology, firstly, the molding technology is used to manufacture a stencil with a hollow resistor configuration. Next, the resistor lump (or called resistance paste) is coated on the stencil to manufacture a resistor. The advantage of the stencil printing technology lies in that the manufactured resistor has a fixed shape and the resistance variability of the resistor is relatively small. However, the resistor manufactured through the stencil printing technology has two serious disadvantages. The first one is that the manufacturing cost of the resistor is quite high, and the other is that the variability of the design and the application of the resistor are not flexible. Therefore, recently, each manufacturer usually uses the screen printing technology.

In the screen printing technology, a scraper is used to scrape the resistor lump positioned on the cloth. The resistor lumps are printed on the substrate through small meshes on the screen. The shape of the resistor depends on the distribution of the resistor lumps on the screen, and thus, during the circuit design, the suitable resistor is designed according to the layout design. In addition, when it is required to correct the circuit layout, merely the screen is replaced to perform the process, without necessarily remolding, so as to greatly improve the time effectiveness for the mass production of the product. Therefore, the screen printing technology has the advantages of high design flexibility, low cost, easy transportation, higher throughput, and environmentally friendly, etc.

However, the screen printing technology has a disadvantage, that is, when the scraper scrapes the screen to perform the screen printing, the central part of the screen is more severely affected by the stress of the scraper than those of other parts, so that the screen is bent and deformed. Therefore, the stress forced on the central part of the resistor lump printed on the substrate surface is greater than that of the two sides, and as a result, the central part of the resistor lump is recessed. In addition, the higher the length ratio of the resistor is, the more serious the recess situation of the resistor is, and the higher the resistance variability of the resistor is. When the resistors with defects are applied to a passive attenuator, a matched terminal load, or other systems, it easily causes that each apparatus or each system cannot be normally operated.

In order to solve the recessing problem of the resistor, U.S. Pat. No. 6,187,372 provides an auxiliary structure disposed under the screen printed resistor to solve the above problem. However, as for the resistor manufactured by the method, not only the thickness of the resistor is still not uniform, but the variability of the resistor is also quite high. The reason lies in that a supporter is disposed under the central position of the resistor, such that the thickness of the resistor at the central position is not the same as that of the two sides, and the sectional area of the resistor is reduced. As a result, the resistance of the resistor is increased, and it is difficult to accurately evaluate the resistance of the resistor.

In addition, U.S. Pat. No. 7,038,571 provides a method of using a lateral-wing metal auxiliary structure to reduce the recessing situation of the resistor. However, when the method is used to manufacture a resistor with a high length ratio, the resistor layout design is quite difficult. Besides, the wing metal auxiliary structure used in the method occupies the circuit area.

In view of the above, each manufacturer exerts their effect to seek for a suitable solution to overcome the above problem.

SUMMARY OF THE INVENTION

Accordingly, the present invention is directed to a resistor layout structure for making the resistors with more uniform thickness.

The present invention is directed to a method of manufacturing a resistor layout, so as to reduce the resistance variability of the resistor.

As embodied and broadly described herein, the present invention provides a resistor layout structure, which includes a first substrate and a first resistor. The first resistor includes a plurality of first metals and plurality of first resistor lumps. The first metals are disposed on the first substrate. The first resistor lumps are disposed on the first substrate. The first metals are used as a supporting structure during the disposing process, and the first metals are interlaced and connected in series with the first resistor lumps to form the first resistor.

The present invention provides a method of manufacturing a resistor layout, including providing a first substrate, and disposing a plurality of first metals on the first substrate. In addition, a plurality of first resistor lumps is disposed on the first substrate, the first metals are used as the supporting structure during the disposing process, and the first metals are interlaced and connected in series with the first resistor lumps to form the first resistor.

In the present invention, a plurality of metals is disposed on the substrate, and a plurality of resistor lumps is disposed on the substrate. The metals are used as the supporting structure during the disposing process, and the metals are interlaced and serially connected with the resistor lumps to form the resistor. Therefore, the resistance variability of the resistor is reduced.

In order to make the aforementioned and other objects, features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1B:
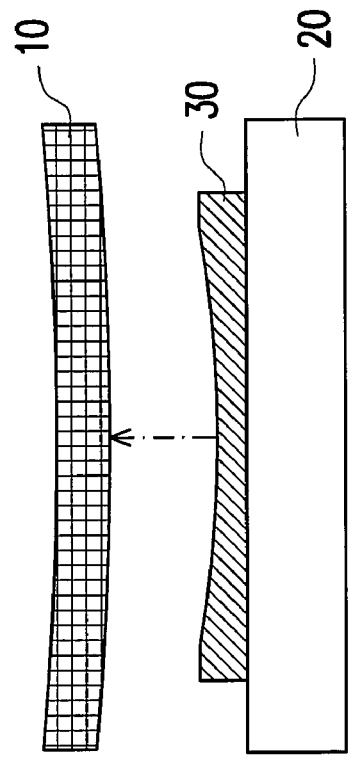
FIG. 1B is a schematic sectional view of the screen deformation taken along the line I-I' in FIG. 1A.
Figure 1A:
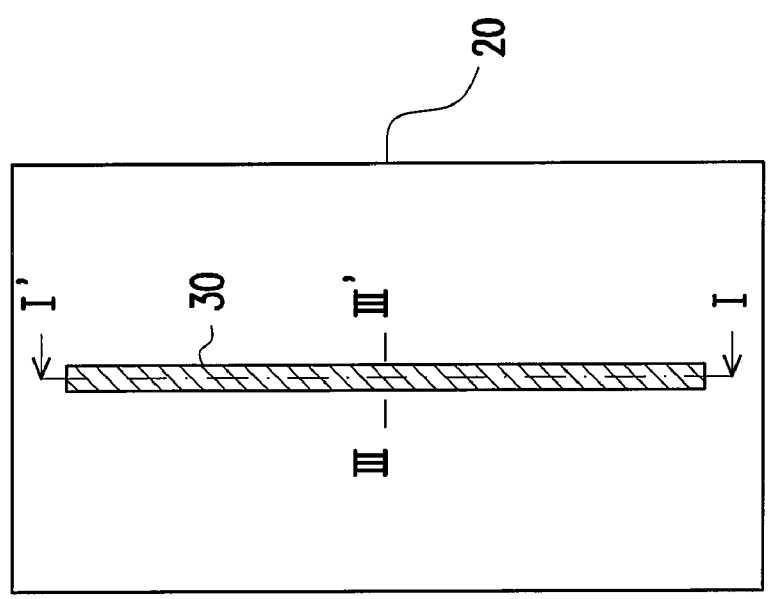
FIG. 1A is a schematic view (top view) of a conventional resistor layout structure.

FIG. 1A is a schematic view (top view) of a conventional resistor layout structure. FIG. 1B is a schematic sectional view of a screen deformation taken along the line of I-I' in FIG. 1A. Referring to FIGS. 1A and 1B, in the conventional art, during the process of using a screen 10 to print a resistor 30 on a substrate 20, the screen 10 may be bended and deformed because of the stress generated by a scraper (not shown), so the resistor 30 obtained through the screen printing technology in the conventional art usually has the central recess, such that the resistance variability of the resistor 30 is relatively high.

Figure 2A:
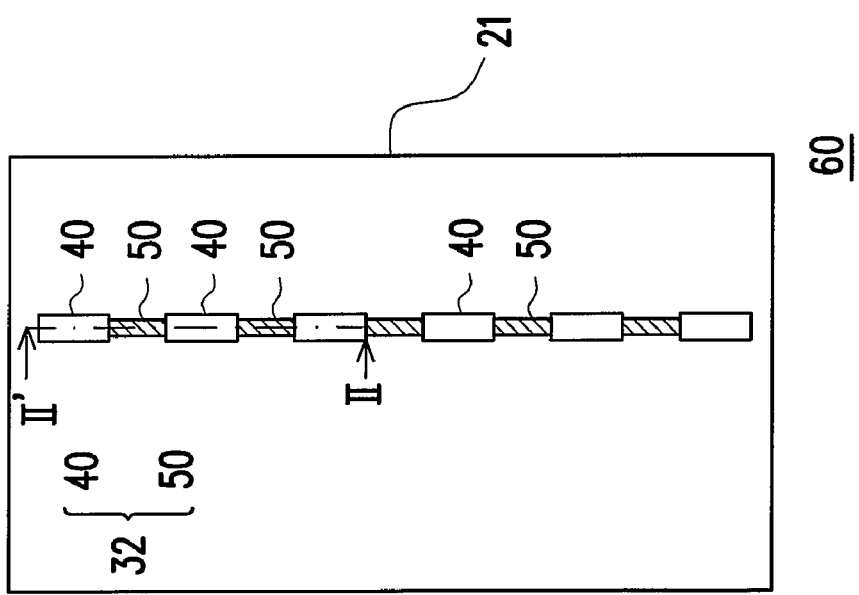
FIG. 2A is a schematic view (top view) of a resistor layout structure according to a first embodiment of the present invention.
Figure 2B:
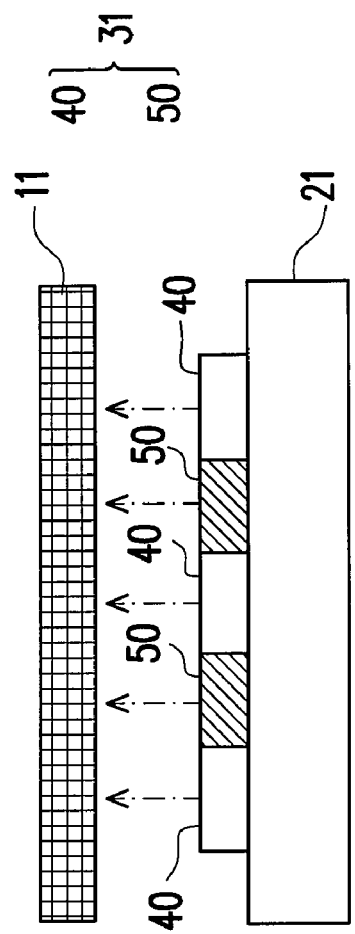
FIG. 2B is a schematic sectional view of using the metal to prevent the screen deformation taken along the line II-II' in FIG. 2A.

FIG. 2A is a schematic view (top view) of a resistor layout structure according to a first embodiment of the present invention. FIG. 2B is a schematic sectional view of using the metal to prevent the screen deformation taken along the line II-II' in FIG. 2A. Referring to FIGS. 2A and 2B, a resistor layout structure 60 includes a substrate 21 and a resistor 32, in which the resistor 32 includes a plurality of metals 40 and a plurality of resistor lumps 50. In order to solve the recess problem of the resistor 30 in FIG. 1, in this embodiment, first, a plurality of metals 40 is disposed on the substrate 21 to serve as a supporting structure during the printing process, and six metals 40 are set as an example for illustration in this embodiment. Next, the plurality of resistor lumps 50 (or resistance paste) is printed on the substrate 21 through the screen printing technology, and the plurality of metals 40 is interlaced and connected in series with the plurality of resistor lumps 50 to form the resistor 31. It should be noted that, although the screen printing technology, for example, is used to dispose the resistor lumps 50 on the substrate 21 in this embodiment, other technologies are further used to dispose the resistor lumps 50 on the substrate 21 in other embodiments, for example, a rolling printing technology, etc.

Accordingly, the substrate 21 is, for example, a printed circuit board, an integrated circuit carrier board, an aluminum oxide substrate, a ceramic substrate, or a co-fired ceramic substrate, etc. More particularly, the substrate 21 is comprised of polyacetamide, resin polymer, glass fiber, or materials with a high dielectric constant, with a dielectric constant within a range between 15 and 80. The metal 40 is, for example, platinum and copper etc. The resistor lump 50 is, for example, a paste containing high conductivity materials, and particularly, the component of the paste includes, for example, metal powder, metal oxide, graphite, or any combination thereof, etc. In addition, it should be noted that, in this embodiment, the plurality of metals 40 are made of the same material, and the plurality of resistor lumps 50 are made of the same material. In other embodiments, the plurality of metals 40 are made of different materials, and the plurality of resistor lumps 50 are made of different materials.

In view of the above, during the process of disposing the resistor lump 50 on the substrate 21, the metal 40 can support the screen 11, such that the screen 11 maintains the horizontal structure in the printing process. Therefore, the thickness of the resistor 31 printed by the screen 11 is more uniform. In addition, the metal 40 of this embodiment is a part of the resistor 31. In other words, in this embodiment, only the resistor 31 is used as the supporting structure to reduce the deformation of the screen 11, so as to solve the problem of the conventional art that an additional auxiliary structure is required to reduce the deformation of the screen 11. From another viewpoint, this method can also reduce the recess of the resistor lumps 50, so as to reduce the resistance variability of the resistor lumps 50. Besides, the method eliminates the layout difficulty for the long ratio resistor resulted by the auxiliary structure in the conventional art, such that a resistor with a large resistance is manufactured in a space with a small area.

In the above embodiments, although the number of the metals 40 is, for example, only five for illustration, those of ordinary skill in the art can use any number of the metals 40 and resistor lumps 50. In addition, although the metals 40 and the resistor lumps 50 have elongated shapes for illustration in this embodiment, in other embodiments, the metals 40 and the resistor lumps 50 can be modified into any other shape, for example, trapezium, and parallelogram etc. In addition, it should be noted that, the larger the length ratio of the resistor lumps 50 is, the more serious the recess situation is. Therefore, in another embodiment, the aspect ratio of the resistor lumps 50 is controlled to fall between 0.5 and 5, and in this manner, the recessing degree of the resistor lumps 50 is reduced.

Figure 3A:
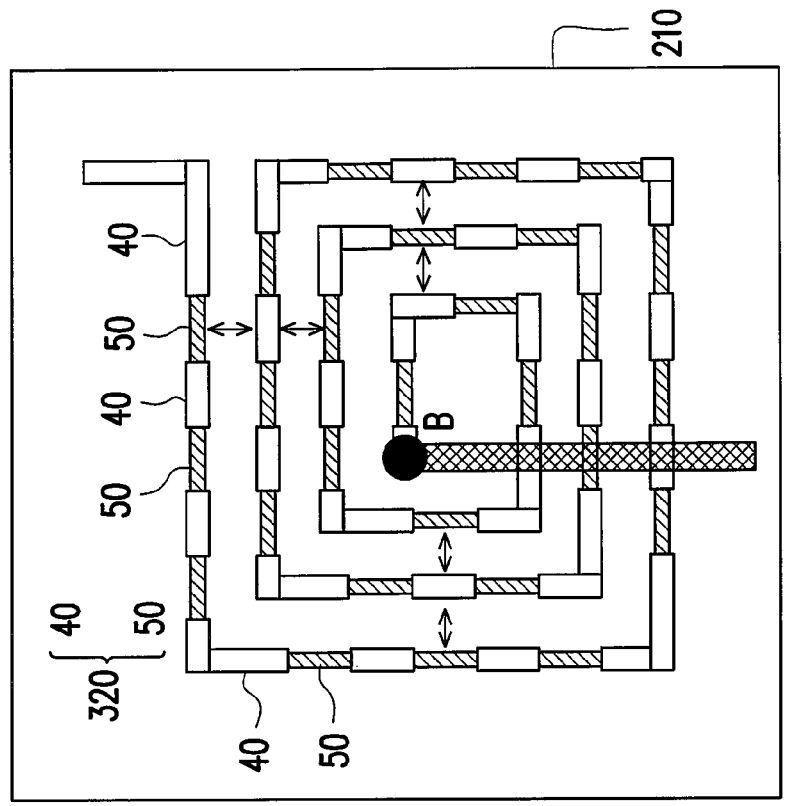
FIG. 3A is a schematic view (top view) of a rectangular spiral-shaped resistor layout structure according to a second embodiment of the present invention.

Those of ordinary skill in the art can modify the layout shape of the resistor 32 according to the actual requirements, without departing from the spirits of the present invention, under the teaching of the above embodiments. For example, FIG. 3A is a schematic view (top view) of a rectangular spiral-shaped resistor layout structure according to a second embodiment of the present invention. Referring to FIG. 3A, in this embodiment, the method of manufacturing the resistor 32 can be obtained with reference to the above embodiments, so it will not be repeated. In this embodiment, the resistor 32 has a rectangular spiral-shaped layout, which is advantageous in manufacturing the resistor 32 with large resistance in the small area. It should be particularly noted that, not only the metals 40 are interlaced and serially connected with the resistor lumps 50, but also a part of the metals 40 are arranged side by side with a part of the resistor lumps 50 (as indicated by the bi-directional arrow in FIG. 3A). Also, a part of the metals 40 is not arranged side by side with a part of the resistor lumps 50.

More particularly, during the printing process, the metals 40 marked by the bi-directional arrow can be meanwhile used as the supporting structure for the resistor lumps 50 directly contacting with and being arranged side by side with the metals 40. In other words, during the printing process, the metals 40 can be used as the supporting structure for the peripheral resistor lumps 50, and the smaller the distance between the metal 40 and the resistor lump 50 is, the better the supporting effect is. From another viewpoint, in this embodiment, only the layout shape of the resistor 32 is changed to enable the resistor lump 50 to have more metals 40 serving as the supporting structure, without necessarily adding an auxiliary structure or requiring an additional cost.

Figure 3B:
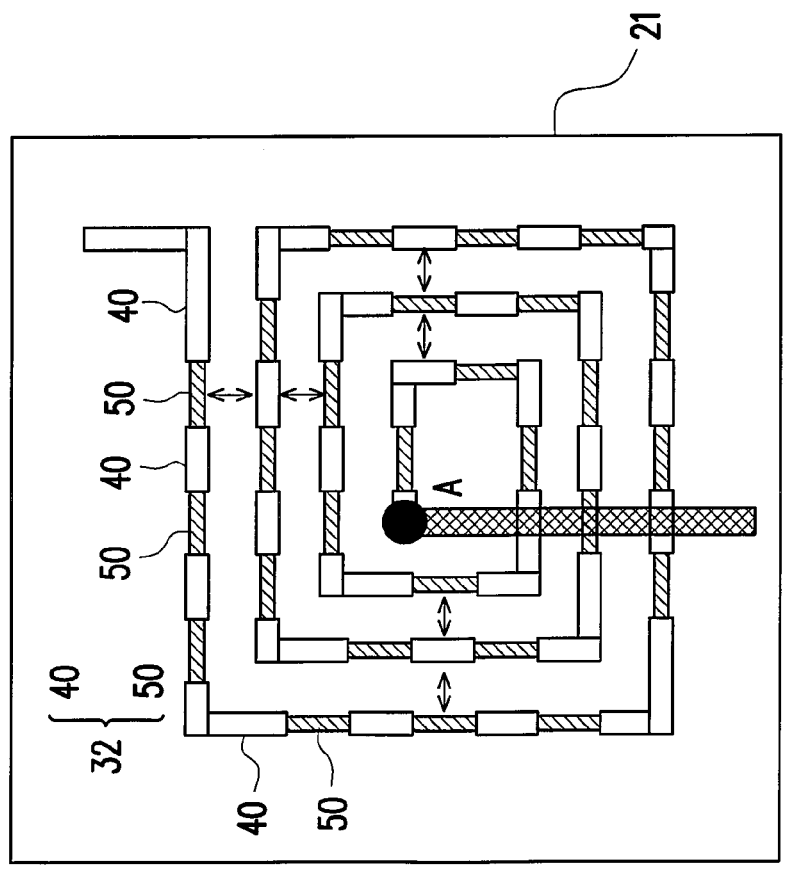
FIG. 3B is a schematic view (top view) of another rectangular spiral-shaped resistor layout structure according to the second embodiment of the present invention.

In addition, those of ordinary skill in the art can manufacture the resistor 32 into a three-dimensional structure, for example, FIG. 3B is a schematic view (top view) of another rectangular spiral-shaped resistor layout structure according to the second embodiment of the present invention. Referring to FIGS. 3A and 3B, in this embodiment, the implementation manner of the resistor 320 for the substrate 210 can be obtained with reference to that of the resistor 32 of FIG. 3A, and the description thereof will not be repeated. It should be noted that, by combining the substrate 21 of FIG. 3A with the substrate 210 of FIG. 3B, the terminal A of the resistor 32 is electrically connected with (serially connected with) the terminal B of the resistor 320, such that the resistor 32 and the resistor 320 can be combined into a resistor with a higher resistance. In other words, those skilled in the art can manufacture the resistor with a larger resistance and having a three-dimensional structure by means of combining a plurality of substrates. In this embodiment, the resistors 32 and 320 are, for example, electrically connected in series, but in another embodiment, the resistors 32 and 320 can also be electrically connected in parallel, thereby manufacturing a resistor capable of providing a relatively large current capacity.

Although the rectangular spiral-shaped resistor layout structure is set as an example in the above embodiments, it can be modified into a resistor layout structure having a round spiral shape, a polygon spiral shape, or an S shape in other embodiments. For example, FIG. 4 a schematic view (top view) of an S-shaped resistor layout structure according to a third embodiment of the present invention. The implementation manner and the effect can be obtained with reference to the above embodiments, which will not be described herein.

Figure 5:
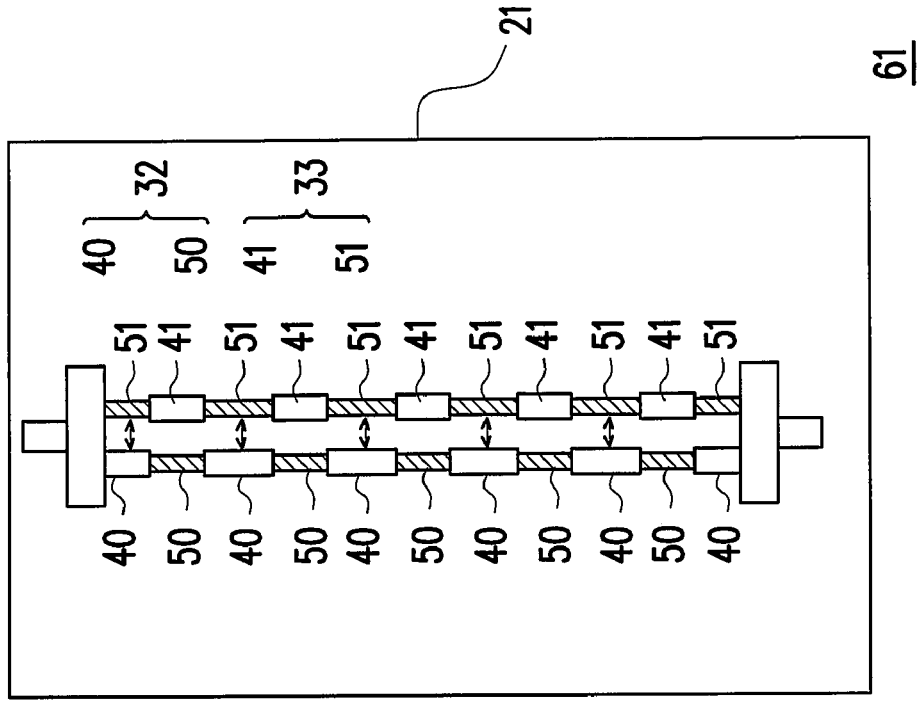
FIG. 5 is a schematic view (top view) of a resistor layout structure connected with a plurality of resistors in parallel according to a fourth embodiment of the present invention.

FIG. 5 is a schematic view (top view) of a resistor layout structure connected with a plurality of resistors in parallel according to a fourth embodiment of the present invention. Referring to FIG. 5, the resistor layout structure 61 includes a substrate 21, a resistor 32, and a resistor 33. The substrate 21 and the resistor 32 can be implemented with reference to the embodiment of FIG. 2, and therefore the description thereof is not repeated. It should be noted that the resistor 32 is electrically connected in parallel with the resistor 33, which has an advantage that the resistor formed by the resistors 32 and 33 can provide a larger current capacity. In addition, the metals 40 of the resistor 32 are arranged side by side with the resistor lumps 51 of the resistor 33, and the resistor lumps 50 of the resistor 32 are arranged side by side with the metals 41 of the resistor 33 (as indicated by the bi-directional arrow in FIG. 5). The advantage is that, during the printing process, the metals 40 can be used as the supporting structure for the interlaced and serially-connected resistor lumps 50, and can also be used as the supporting structure for the resistor lumps 51 arranged side by side with the metals 40. Similarly, the metals 41 can be used as the supporting structure for the interlaced and serially-connected resistor lumps 51, and can also be used as the supporting structure for the resistor lumps 50 arranged side by side with the metals 41. Therefore, the recess of the resistor lumps 50 and 51 can be greatly reduced.

In the above embodiments, although the resistor layout structure with two resistors connected in parallel is set as an example for illustration, different numbers of resistors may be connected in parallel in other embodiments, thereby increasing the current tolerated by the resistor.

It should be noted that, although a possible configuration of the resistor layout structure has been described in the above embodiments, those of ordinary skill in the art should know that the designs of the resistor layout structure for each manufacturer are different, so the applications of the present invention are not limited to the possible configurations. In other words, it satisfies the spirits of the present invention, as long as the resistor layout structure has the interlaced and serially-connected resistor lumps and metals.

Figure 6:
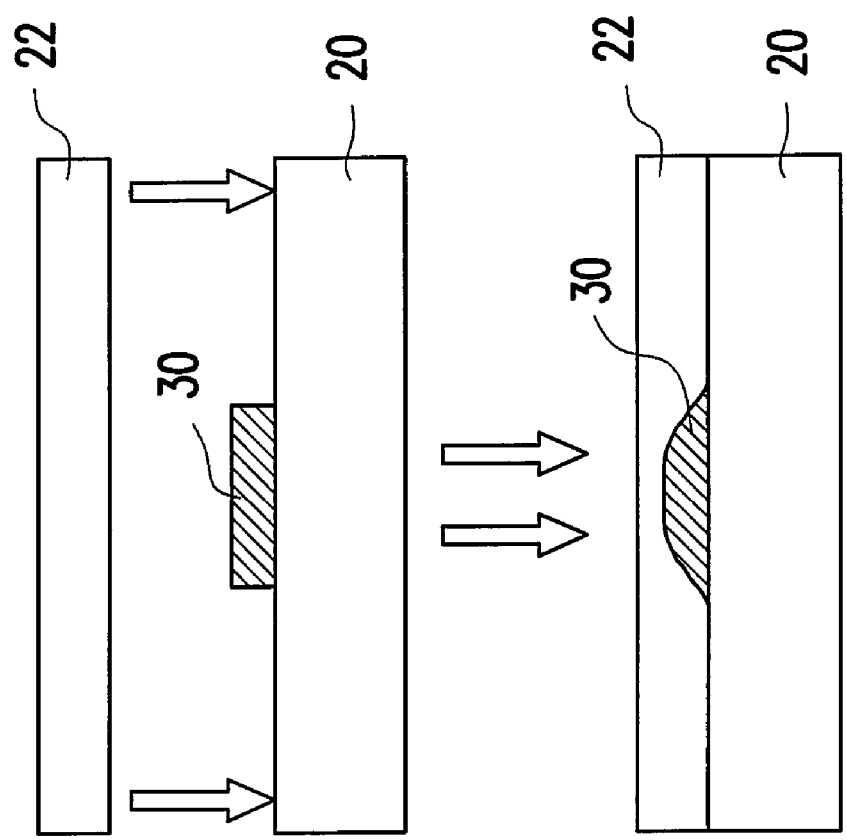
FIG. 6 is a schematic sectional view of the resistor layout structure when laminating the substrates taken along the line of III-III' in FIG. 1A.

In addition, the resistor layout structure designed according to the spirit of the present invention further has advantages in other aspects. For example, FIG. 6 is a schematic sectional view of the resistor layout structure when laminating the substrates taken along the line of III-III' in FIG. 1A. Referring to FIGS. 1A and 6, in the conventional art, the resistor 30 is usually embedded between the substrates 20 and 22. However, when the substrates 20 and 22 are laminated, the serious deformation of the resistor 30 usually occurs. Therefore, the finished product of the embedded resistor 30 has large resistance variability.

Figure 4:
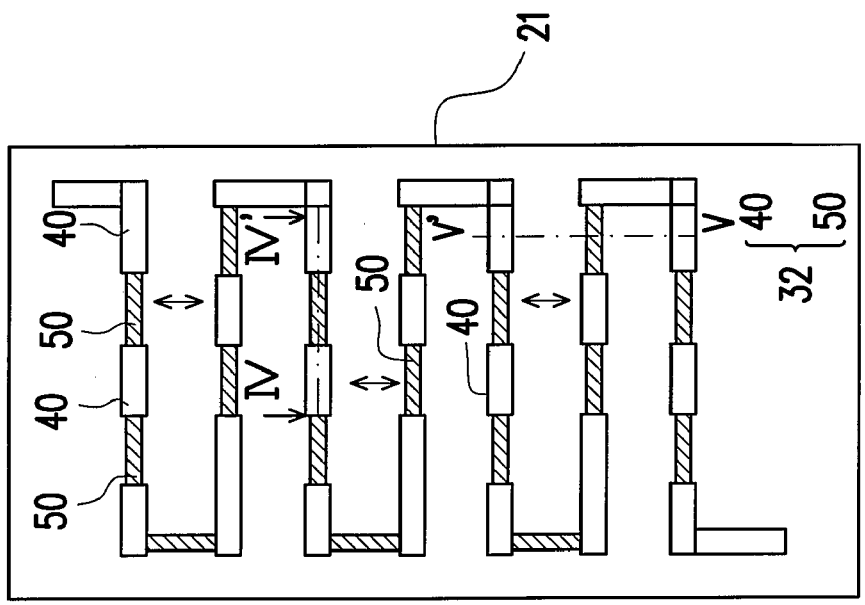
FIG. 4 is a schematic view (top view) of an S-shaped resistor layout structure according to a third embodiment of the present invention.
Figure 7A:
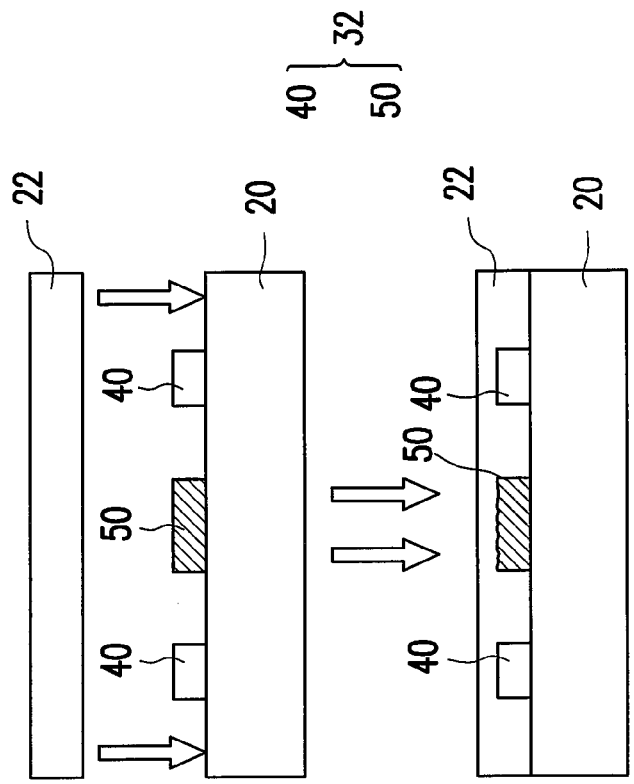
FIG. 7A is a schematic sectional view of the resistor layout structure when laminating the substrates taken along the line of IV-IV' in FIG. 4.
Figure 7B:
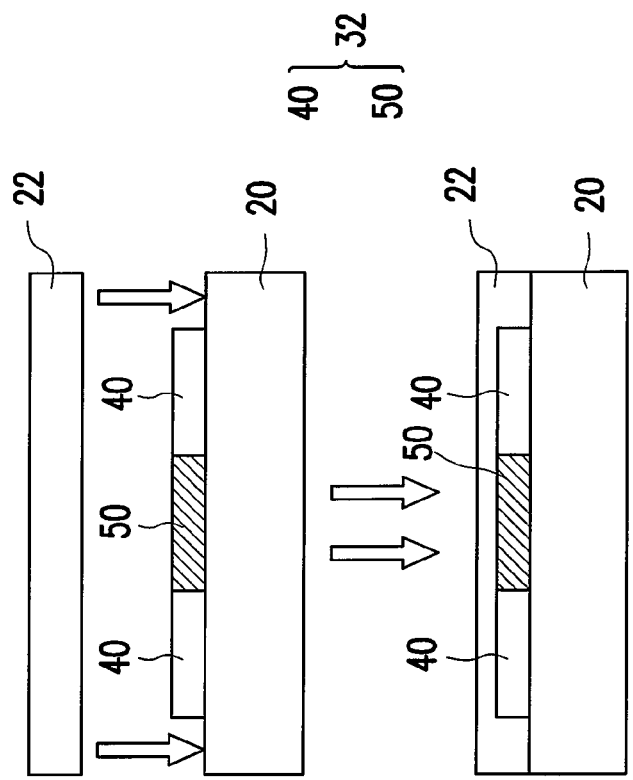
FIG. 7B is a schematic sectional view of the resistor layout structure when laminating the substrates taken along the line of V-V' in FIG. 4.

However, the resistor layout structure designed according to the present invention can greatly reduce the resistance variability of the embedded resistor. FIG. 7A is a schematic sectional view of the resistor layout structure when laminating the substrates taken along the line of IV-IV' in FIG. 4. FIG. 7B is a schematic sectional view of the resistor layout structure when laminating the substrates taken along the line of V-V' in FIG. 4. Referring to FIGS. 7A, 7B, and 4, the resistor layout structure designed according to the spirit of the present invention has the interlaced and serially connected metals 40 and resistor lumps 50, so when the substrates 21 and 22 are laminated, the metals 40 can be used as the supporting structure for the substrates 21 and 22, such that the substrate 22 has a desired flatness. For the resistors lumps 50, due to the metals 40, the pressing stress of the substrate 22 is scattered on the surface of the resistor 32. Therefore, the resistor 32 maintains its original physical shape and characteristics, so as to greatly reduce the resistance variability of the resistor 32.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A resistor layout structure, comprising:
   a first resistor, disposed on a first substrate and comprising:
      a plurality of first metals, disposed on the first substrate; and
      a plurality of first resistor lumps, disposed on the first substrate, wherein the first metals are used as a supporting structure to reduce the deformation of a screen during a disposing process for disposing the first resistor lumps, and the first metals are interlaced and connected in series with the first resistor lumps to form the first resistor.

2. The resistor layout structure as claimed in claim 1, wherein the first metals are comprised of different materials.

3. The resistor layout structure as claimed in claim 1, wherein the first metals are comprised of the same material.

4. The resistor layout structure as claimed in claim 1, wherein the first resistor lumps are comprised of different materials.

5. The resistor layout structure as claimed in claim 1, wherein the first resistor lumps are comprised of the same material.

6. The resistor layout structure as claimed in claim 1, wherein the first resistor lumps are disposed on the first substrate through a printing technology.

7. The resistor layout structure as claimed in claim 1, wherein the first resistor is disposed on the first substrate in a spiral-shaped layout.

8. The resistor layout structure as claimed in claim 1, wherein the first resistor is disposed on the first substrate in an S-shaped layout.

9. The resistor layout structure as claimed in claim 1, wherein a part of the first metals are arranged side by side with a part of the first resistor lumps.

10. The resistor layout structure as claimed in claim 1, further comprising:
   a second resistor, comprising:
   a plurality of second metals, disposed on the first substrate; and
   a plurality of second resistor lumps, disposed on the first substrate, wherein the second metals are used as a supporting structure, and the second metals are interlaced and connected in series with the second resistor lumps to form the second resistor, wherein the first resistor is electrically connected in parallel with the second resistor, a part of the first metals are arranged side by side with a part of the second resistor lumps, and a part of the second metals are arranged side by side with a part of the first resistor lumps.

11. The resistor layout structure as claimed in claim 1, further comprising:
   a second substrate, wherein when the first substrate is laminated with the second substrate, the first metals are used as the supporting structure between the first substrate and the second substrate.

12. The resistor layout structure as claimed in claim 1, further comprising:
   a second substrate; and
   a second resistor, comprising:
   a plurality of second metals, disposed on the second substrate; and
   a plurality of second resistor lumps, disposed on the second substrate, wherein the second metals are used as a supporting structure, and the second metals are interlaced and connected in series with the second resistor lumps to form the second resistor, wherein the second substrate is combined with the first substrate, such that the first resistor is electrically connected with the second resistor.

13. The resistor layout structure as claimed in claim 1, wherein the first substrate is a printed circuit board, an integrated circuit carrier board, an aluminum oxide substrate, a ceramic substrate or a co-fired ceramic substrate.

14. The resistor layout structure as claimed in claim 1, wherein the aspect ratio of the first resistor lumps is between 0.5 and 5.

15. A method of manufacturing a resistor layout, comprising:
   disposing a plurality of first metals on a first substrate; and
   disposing a plurality of first resistor lumps on the first substrate, wherein the first metals are used as a supporting structure to reduce the deformation of a screen during the step for disposing the plurality of first resistor lumps, and the first metals are interlaced and connected in series with the first resistor lumps to form a first resistor.

16. The method of manufacturing the resistor layout as claimed in claim 15, wherein the first resistor lumps are disposed on the first substrate through a printing technology.

17. The method of manufacturing the resistor layout as claimed in claim 15, further comprising disposing the first resistor on the first substrate in a spiral-shaped layout.

18. The method of manufacturing the resistor layout as claimed in claim 15, further comprising disposing the first resistor on the first substrate in an S-shaped layout.

19. The method of manufacturing the resistor layout as claimed in claim 15, further comprising arranging a part of the first resistor lumps side by side with a part of the first metals.

20. The method of manufacturing the resistor layout as claimed in claim 15, further comprising:
   disposing a plurality of second metals on the first substrate; and
   disposing a plurality of second resistor lumps on the first substrate, wherein the second metals are used as a supporting structure during the step for disposing the plurality of second resistor lumps, and the second metals are interlaced and connected in series with the second resistor lumps to form a second resistor, the first resistor is electrically connected in parallel with the second resistor, a part of the first metals are arranged side by side with a part of the second resistor lumps, and a part of the second metals are arranged side by side with a part of the first resistor lumps.

21. The method of manufacturing the resistor layout as claimed in claim 15, further comprising laminating a second substrate with the first substrate, wherein the first metals are used as the supporting structure between the first substrate and the second substrate.

22. The method of manufacturing the resistor layout as claimed in claim 15, further comprising:
   providing a second substrate;
   disposing a plurality of second metals on the second substrate;
   disposing a plurality of second resistor lumps on the second substrate, wherein the second metals are used as a supporting structure during the step for disposing the plurality of second resistor lumps, and the second metals are interlaced and connected in series with the second resistor lumps to form a second resistor; and
   combining the first substrate with the second substrate, such that the second resistor is electrically connected with the first resistor.

* * * * *